US012796271B2

(12) United States Patent
Cao et al.

(10) Patent No.: US 12,796,271 B2
(45) Date of Patent: Nov. 10, 2026

(54) DISPLAY PANEL AND DISPLAY DEVICE

(71) Applicant: Wuhan Tianma Microelectronics Co., Ltd., Wuhan (CN)

(72) Inventors: Leilei Cao, Wuhan (CN); Yaqi Kuang, Wuhan (CN)

(73) Assignee: Wuhan Tianma Microelectronics Co., Ltd., Wuhan (CN)

( * ) Notice: Subject to any disclaimer, the term of this patent is extended or adjusted under 35 U.S.C. 154(b) by 839 days.

(21) Appl. No.: 17/848,469

(22) Filed: Jun. 24, 2022

(65) Prior Publication Data

US 2022/0320262 A1 Oct. 6, 2022

(30) Foreign Application Priority Data

Jun. 25, 2021 (CN) ........................ 202110713392.6

(51) Int. Cl.
*H10K 59/38* (2023.01)
*H10K 59/12* (2023.01)
(Continued)

(52) U.S. Cl.
CPC ............. *H10K 59/38* (2023.02); *H10K 59/12* (2023.02); *H10K 59/122* (2023.02); *H10K 59/1315* (2023.02); *H10K 59/8792* (2023.02)

(58) Field of Classification Search
CPC .. H10K 59/122; H10K 59/1315; H10K 59/12; H10K 59/8792; H10K 59/38; H10K 59/35; H10K 59/123; H10K 59/179
See application file for complete search history.

(56) References Cited

U.S. PATENT DOCUMENTS

2018/0301515 A1* 10/2018 Huang .................. G06F 3/0412
2020/0410192 A1* 12/2020 Kim ....................... G01B 17/00
(Continued)

FOREIGN PATENT DOCUMENTS

CN 107680960 A 2/2018
CN 109449163 A 3/2019
(Continued)

OTHER PUBLICATIONS

First Office Action for Chinese Patent Application No. 202110713392.6, dated Mar. 28, 2022 (12 pages).

*Primary Examiner* — Marlon T Fletcher
*Assistant Examiner* — Kimberly Newman Frey
(74) *Attorney, Agent, or Firm* — KDW FIRM PLLC

(57) ABSTRACT

Provided display panel includes a substrate, a light emitting unit and a first metal layer. The light emitting unit includes a first electrode, a light emitting layer and a second electrode sequentially laminated in a light emitting direction. The first metal layer includes multiple first metal portions extending in a first direction, a side surface of the first metal portion facing away from the substrate provided with multiple first grooves extending in first direction and arranged in second direction. The first groove forms a grid-like surface on a side of the first metal portion facing away from the substrate. The first electrode enabled to have a relatively flat surface, whereby scattering phenomenon of light emitted by the light emitting element and scattering phenomenon of the first electrode on the reflected ambient light is ameliorated, the scattering problem of the display panel is resolved, and the display effect is improved.

19 Claims, 6 Drawing Sheets

(51) Int. Cl.

| | |
|---|---|
| ***H10K 59/122*** | (2023.01) |
| ***H10K 59/131*** | (2023.01) |
| ***H10K 59/80*** | (2023.01) |

(56) References Cited

U.S. PATENT DOCUMENTS

| | | | | |
|---|---|---|---|---|
| 2021/0288131 | A1* | 9/2021 | Guo | H10K 59/121 |
| 2021/0288294 | A1* | 9/2021 | Guo | H10K 59/38 |
| 2021/0366950 | A1* | 11/2021 | Chen | H10D 86/443 |
| 2022/0190042 | A1* | 6/2022 | Ye | G06F 3/0412 |
| 2023/0050666 | A1* | 2/2023 | Li | G06F 1/1637 |
| 2024/0144849 | A1* | 5/2024 | Han | G09G 3/20 |
| 2024/0274608 | A1* | 8/2024 | Yu | G02F 1/136222 |
| 2025/0127015 | A1* | 4/2025 | Kaneko | G09F 9/30 |

FOREIGN PATENT DOCUMENTS

| | | | |
|---|---|---|---|
| CN | 109728197 | A | 5/2019 |
| CN | 109801954 | A | 5/2019 |
| CN | 208861989 | U | 5/2019 |
| CN | 110416257 | A | 11/2019 |
| CN | 111769148 | A | 10/2020 |
| CN | 111952342 | A | 11/2020 |
| CN | 112133735 | A | 12/2020 |
| CN | 112670325 | A | 4/2021 |
| CN | 112750882 | A | 5/2021 |
| CN | 112786812 | A | 5/2021 |
| KR | 20190076218 | A | 7/2019 |
| KR | 20210034194 | A | 3/2021 |

* cited by examiner

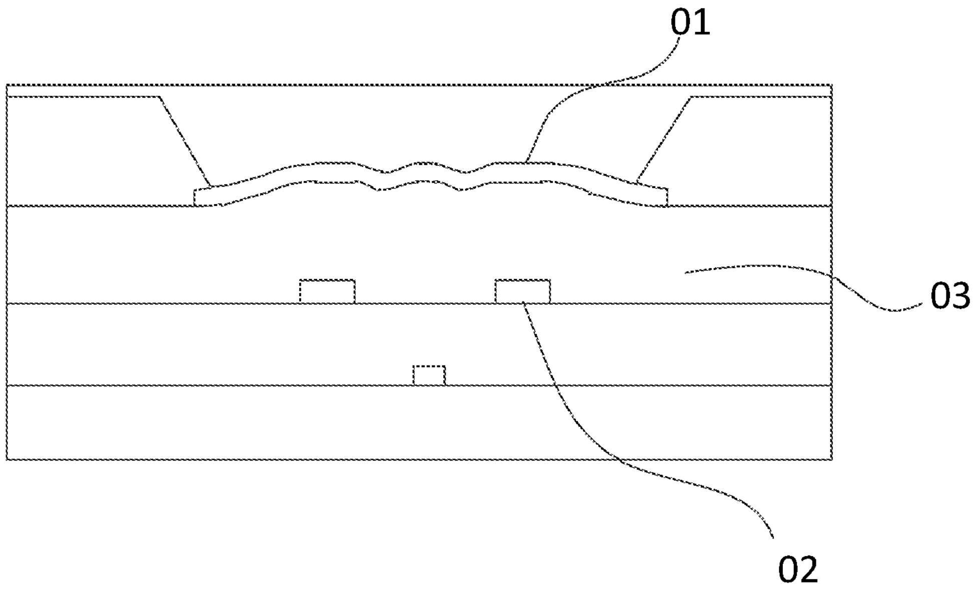
FIG. 1
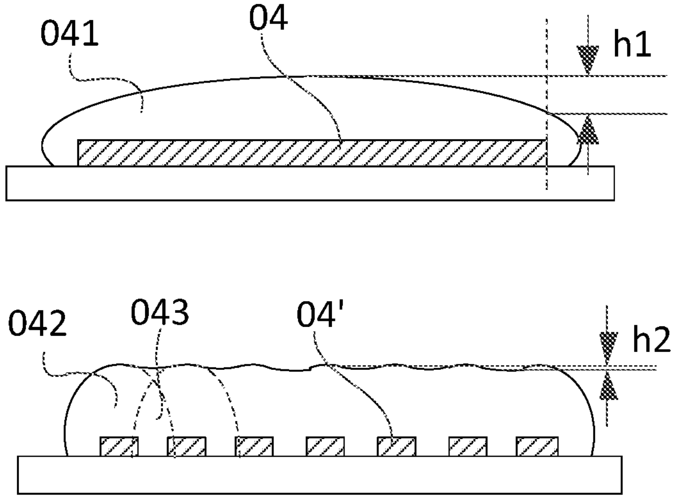

DISPLAY PANEL AND DISPLAY DEVICE

CROSS-REFERENCE TO RELATED APPLICATION(S)

This application claims priority to Chinese Patent Application No. 202110713392.6 filed Jun. 25, 2021, the disclosure of which is incorporated herein by reference in its entirety.

TECHNICAL FIELD

The present disclosure relates to the field of display technologies, and in particular to, a display panel and a display device.

BACKGROUND

An organic light emitting diode (OLED) is used as a light emitting element for an organic light emitting display device. As the OLED has a self-luminous characteristic, no additional light source is needed for the organic light emitting display device, which is conductive to the overall lightening and thinning of the display device and the manufacture of a flexible display screen. In addition, the organic self-luminous display technology also has the characteristics of a fast response speed, a wide viewing angle and the like, and thus has become a focus of a current research.

When an organic light emitting display panel is manufactured, a pixel circuit and the organic light emitting diode are sequentially manufactured on a substrate, which causes that the organic light emitting diode is manufactured on a surface which is not flat, leading to a scattering problem of the display panel, and affecting the display quality.

SUMMARY

The present disclosure provides a display panel. The display panel includes a substrate, a pixel defining layer, a light emitting unit and a first metal layer.

The pixel defining layer is located on a side of the substrate and includes multiple pixel openings arranged in an array. The light emitting unit is located within a pixel opening of the multiple pixel openings and includes a first electrode, a light emitting layer and a second electrode which are sequentially laminated in a light emitting direction of the display panel. The first metal layer is located on a side of the first electrode facing the substrate. The first metal layer includes multiple first metal portions, a vertical projection of a first metal portion on the substrate overlaps with a vertical projection of the first electrode on the substrate, and the first metal portion is provided with multiple first grooves extending in a first direction and arranged in a second direction, and the first direction intersects the second direction within a plane parallel to the substrate.

The present disclosure further provides a display device, which includes the display panel described above.

BRIEF DESCRIPTION OF DRAWINGS

In order to more clearly explain the embodiments of the present disclosure or the technical schemes in the related art, the drawings used in the embodiments or the description of the related art will be briefly introduced below. Obviously, the drawings in the following description are some embodiments of the present disclosure. For those of ordinary skill in the art, other drawings may also be obtained without creative labor according to these drawings.

FIG. 1 is a simplified schematic cross-sectional view of a display panel in the related art;

FIG. 2 is a schematic diagram of a basic principle of a display panel according to the present disclosure;

DETAILED DESCRIPTION

Figure 3:
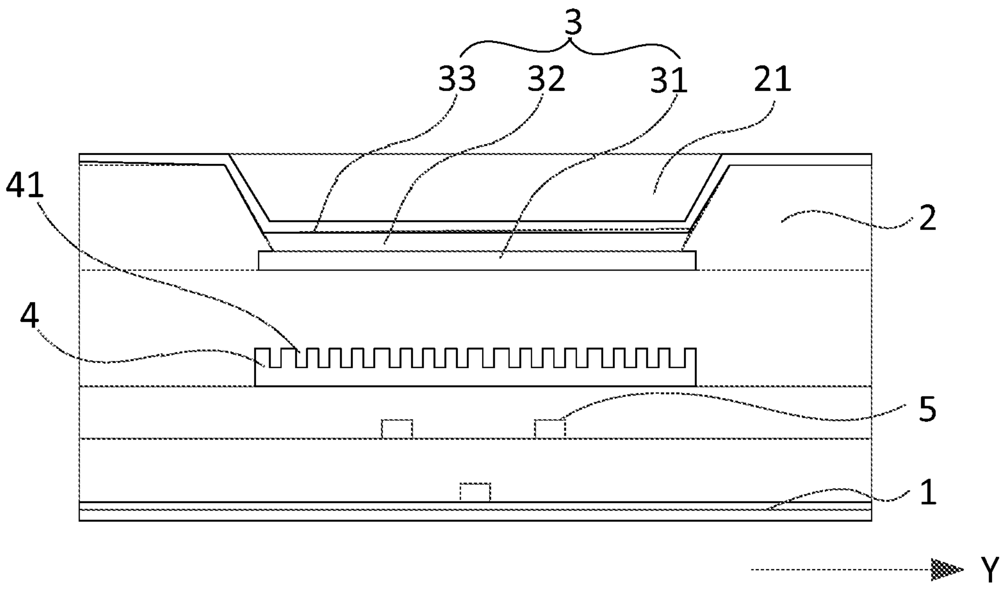
FIG. 3 is a schematic diagram of a display panel according to an embodiment of the present disclosure.

In order to make the purposes, technical schemes and advantages of embodiments of the present disclosure clearer, the technical schemes in the embodiments of the present disclosure will be described clearly and completely below in conjunction with the drawings in the embodiments of the present disclosure. Apparently, the described embodiments are merely part of the embodiments of the present disclosure, rather than all of the embodiments of the present disclosure. All other embodiments obtained by those of ordinary skill in the art based on the embodiments of the present disclosure without requiring creative efforts shall all fall within the scope of protection of the present disclosure.

The terminology used in the embodiments of the present disclosure is for the purpose of describing particular embodiments only and is not intended to be limiting of the present disclosure. As used in the embodiments of the present disclosure and the appended claims, the singular form such as "a," "an," and "the" are intended to include the plural form as well, unless the context clearly indicates otherwise.

FIG. 1 is a simplified schematic cross-sectional view of a display panel in the related art. As shown in FIG. 1, when the display panel is manufactured, as a light emitting unit includes a first electrode 01, metal signal wires 02 are arranged below the first electrode 01 and usually have a certain thickness and are not flat, an insulating layer 03 manufactured on the metal signal wire 02 cannot be formed with a flat surface, which leads to that the first electrode 01 of the light emitting unit manufactured right above a position corresponding to the metal signal wire 02 is not flat. However, as the first electrode 01 of the light emitting unit is generally a reflection electrode and has high reflectivity to light, the first electrode 01 has high reflectivity to ambient light entering the display panel. In this case, ambient light reflected by the first electrode 01 which is not flat may be seriously scattered to adversely affect the quality of the display panel.

In order to increase the flatness of the first electrode 01, a metal portion 04 is generally added below the first electrode 01, the metal portion 04 may provide a relatively flat substrate for the manufacture of the first electrode 01, so that the manufactured first electrode 01 is formed with a relatively flat surface; whereby a scattering phenomenon of light emitted by the light emitting unit and a scattering phenomenon of the first electrode 01 on the reflected ambient light may be ameliorated, the scattering problem of the display panel may be resolved, and thus the quality of the display panel may be improved. However, as shown in FIG. 2, which is a schematic diagram of a basic principle of a display panel according to the present disclosure. If an organic layer pattern 041 is directly made on the whole metal portion 04, because of an adhesion force between an organic film and a metal pattern and a cohesive force of the organic film material, an organic layer pattern corresponding to an edge of the whole metal portion would have a large difference h1 from an organic layer pattern corresponding to a center of the whole metal portion, which is adversely conducive to the flatness of an upper film layer. However, if the whole metal portion 04 is changed into metal grids 04' with intervals, then each grid is in contact with an organic material to generate a separate organic film pattern 042. Two adjacent grids on the grid-like surface are closer, a mutually interfering portion 043 of regions of adjacent organic film patterns 042 is increased, and the interfering portion 043 is accumulated to form an organic film pattern having a flatter surface, and in this case, a segment difference h2 of an organic layer over the whole metal grid 04' is gradually reduced, whereby the flatness of an upper surface of the organic layer is improved. Herein, the segment difference h2 of the organic layer refers to a shortest distance between a plane where a highest point on an upper surface of the organic layer is located and a plane where a lowest point on the upper surface of the organic layer is located, where the upper surface of the organic layers is a surface of the organic layer facing away from the substrate.

Figure 4:
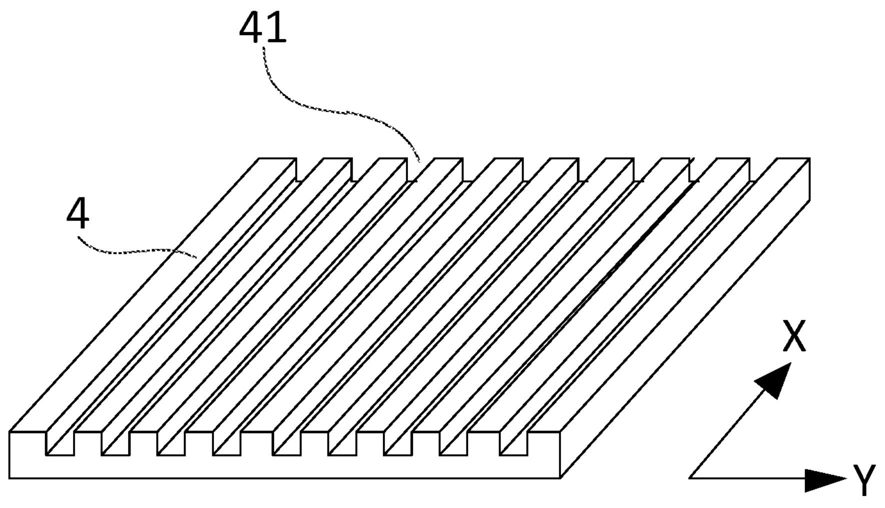
FIG. 4 is a schematic diagram of a first metal portion of a display panel according to an embodiment of the present disclosure.

As shown in FIG. 3, FIG. 3 is a schematic diagram of a display panel according to an embodiment of the present disclosure. Only part of rather than all of a structure of the display panel is schematically shown in the drawing, for simplification. The embodiment of the present disclosure provides a display panel, and the display panel includes a substrate 1, a first metal layer and a light emitting layer which are sequentially laminated in a light emitting direction. The light emitting layer includes a pixel defining layer 2, the pixel defining layer 2 is located on a side of the substrate 1, and the pixel defining layer 2 includes multiple pixel openings 21 arranged in an array (only one of the multiple pixel openings 21 is shown in FIG. 3); the light emitting layer further includes multiple light emitting units 3 corresponding to the pixel openings 21. Each of the multiple light emitting units includes a first electrode 31, a light emitting layer 32 and a second electrode 33 which are sequentially laminated in the light emitting direction of the display panel, where the first metal layer is located on a side of the first electrode 31 facing the substrate 1. The first metal layer includes multiple first metal portions 4 (only one of the multiple first metal portions is shown in FIG. 3). The first metal portion 4 corresponds to the light emitting unit, and a vertical projection of the first metal portion 4 on the substrate 1 overlaps with a vertical projection of the first electrode 31 on the substrate 1, as shown in FIG. 4, which is a schematic diagram of a first metal portion 4 according to an embodiment of the present disclosure, a surface on a side of the first metal portion 4 facing away from the substrate 1 is provided with multiple first grooves 41 extending in a first direction X and arranged in a second direction Y, the first groove 41 forms a grid-like surface on a side of the first metal portion facing away from the substrate, and the first direction X intersects the second direction Y within a plane parallel to the substrate 1.

When a subsequent film layer is manufactured on a surface of the metal portion 4, a first grid structure is formed between two adjacent first grooves 41, each first grid structure is in contact with the organic material to generate a separate organic film pattern, and when two adjacent first grid structures are gradually reduced, a mutually interfering portion of regions of adjacent organic film pattern is increased, whereby the flatness of the upper surface of the organic layer is improved.

Figure 5:
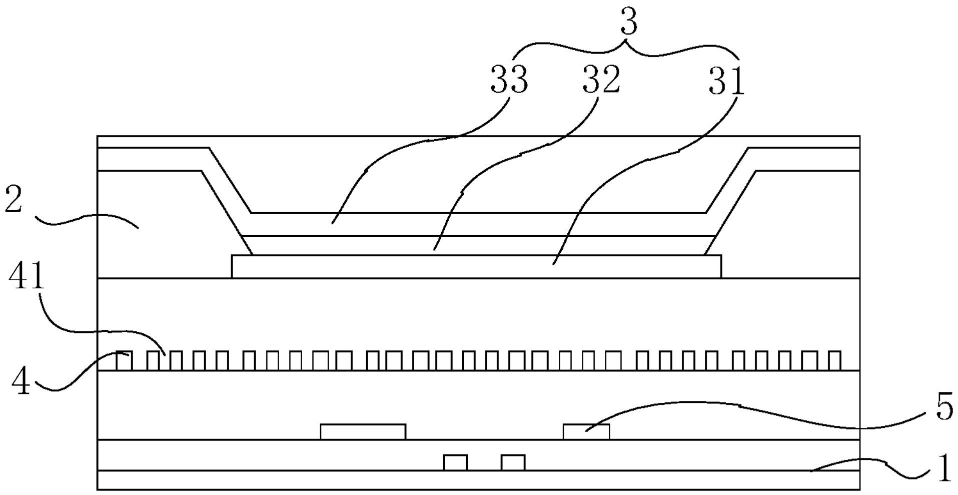
FIG. 5 is a schematic diagram of a display panel according to an embodiment of the present disclosure.

As an embodiment, the first grooves 41 may penetrate through the first metal portion 4 (as shown in FIG. 5, which is a schematic diagram of a display panel according to an embodiment of the present disclosure, and only an implementation is shown in which all of the first grooves 41 penetrate through the first metal portion), or the first grooves 41 may not all penetrate through the first metal portion 4. At least part of the first grooves 41 penetrates through the first metal portion 4 in a direction perpendicular to the substrate 1, and two adjacent first grooves 41 penetrating through the first metal portion 4 divide the first metal portion 4 into multiple first metal strip-shaped structures which extend in the first direction X and are arranged in the second direction Y. Part of the first metal strip-shaped structures may be used for being electrically connected to the metal signal wires 5 below the first metal strip-shaped structures, to balance resistance, and to reduce the influence of voltage difference at different positions of the metal signal wires 5.

Figure 6:
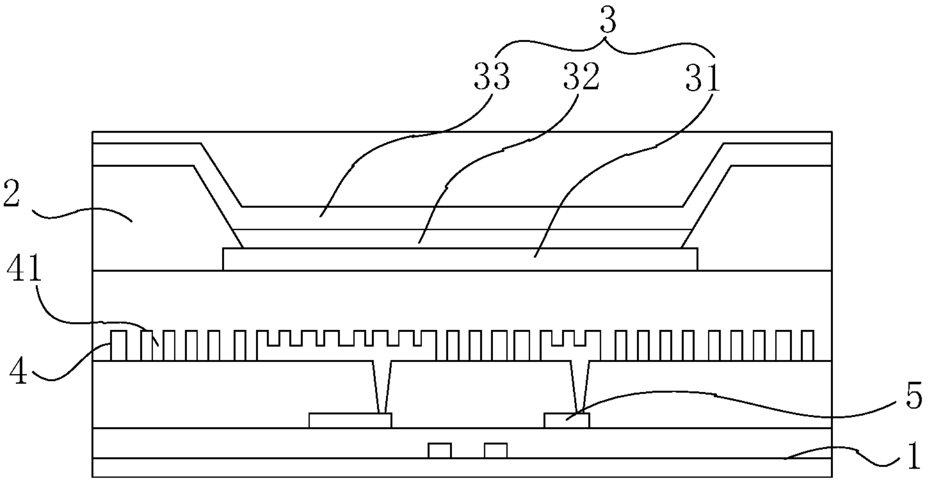
FIG. 6 is a schematic diagram of a display panel according to an embodiment of the present disclosure.

As shown in FIG. 6, FIG. 6 is a schematic diagram of a display panel according to an embodiment of the present disclosure. At least part of the first grooves 41 penetrate through the first metal portion 4, and the first grooves 41 penetrating through the first metal portion 4 divide the first metal portion 4 into different first metal sub-portions 42, and part of the first metal sub-portions 42 may be electrically connected to the metal signal wires 5 below the first metal sub-portions, to balance the resistance. The first metal sub-portions 42 separated from each other may be electrically connected to different metal signal wires 5, so that the influence of voltage difference at different positions of the metal signal wires 5 is reduced.

As an embodiment, a width of the first metal strip-shaped structure is inversely proportional to an arrangement density of the first metal strip-shaped structures in the second direction Y, that is, the width of the first metal strip-shaped structure is the wider, the arrangement density of the first metal strip-shaped structures is the smaller, and the width of the first metal strip-shaped structure is the narrower, the arrangement density of the first metal strip-shaped structures is the larger. As an embodiment, the first metal strip-shaped structures are arranged in a high-density manner, and the high-density means that the arrangement density of the first metal strip-shaped structures is at least larger than a maximum value of an arrangement density of the metal signal wires 5 below the first metal strip-shaped structures. Therefore, an interfering portion of regions of the upper adjacent organic film pattern is increased, and thus the flatness of the upper surface of the organic layer is further improved.

Figure 7:
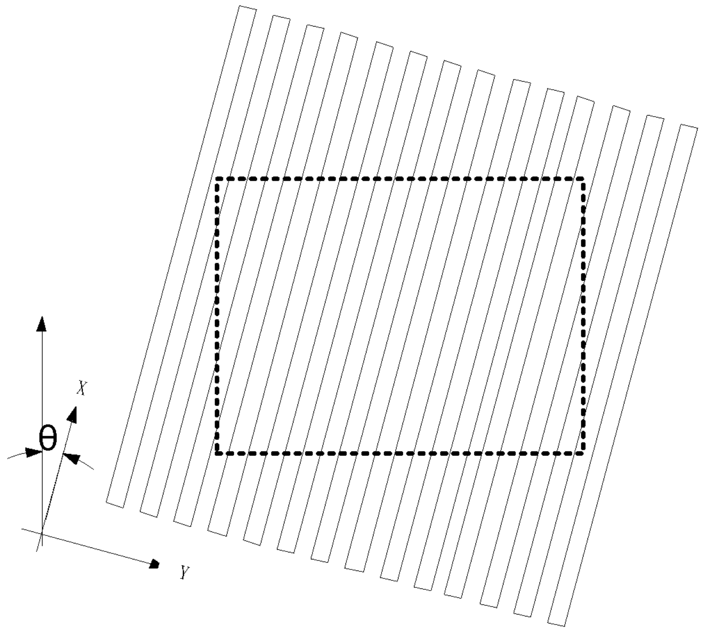
FIG. 7 is a schematic diagram of a display panel according to an embodiment of the present disclosure.

As an embodiment, as shown in FIG. 7, FIG. 7 is a schematic diagram of a display panel according to an embodiment of the present disclosure. An angle θ exists between the first direction X and a pixel column direction in a display region, and $0° < θ < 90°$ is satisfied. That is, the first direction X is neither parallel to the pixel column direction in the display region nor perpendicular to the pixel column direction in the display region, and the first direction X may be understood as in which direction a display panel is viewed by a user from a front viewing angle in practice. When the user views the display panel from the front viewing angle, the pixel column direction may be treated as an up-down direction of a plane where the display panel is located, and a pixel row direction may be treated as a left-right direction of the plane where the display panel is located.

In a case where the density of the first metal strip-shaped structure is not enough to flatten all organic layer segment differences, by providing a certain angle formed between the first direction X and the pixel column direction in the display region, a certain angle may be formed between an extending direction of a fluctuating region of the organic layer and the pixel column direction in the display region, that is, a certain angle is formed between an extending direction of both a fluctuating region of the first electrode 31 and the light emitting layer 32 above and the pixel column direction in the display region, which enables that when the user views the display panel at the front viewing angle in practice, a probability that scattered light emitted by the light emitting unit is captured by the eyes of the user is reduced, whereby the influence of the scattered light of the light emitting unit on the display effect is weakened, and thus the display quality is improved.

As an embodiment, a surface on a side of the first metal portion 4 facing away from the substrate 1 includes multiple second grooves which extend in the second direction and are arranged in the first direction. At least part of the first grooves 41 and at least part of the second grooves are crossed to form a grid. The first grooves 41 and the second grooves are cooperated with each other, so that an upper surface of the first metal portion 4 is changed into a net-grid form from a stripe-grid form, mutual interference portions of regions of organic film patterns may be increased, an organic film pattern with a flatter surface may be formed, an segment difference of an organic layer above the whole metal grid may be further reduced, and thus the flatness of the upper surface of the organic layer is improved, whereby a scattering phenomenon of light emitted by the light emitting unit and a scattering phenomenon of the first electrode 31 on the reflected ambient light may be ameliorated, the scattering problem of the display panel may be resolved, and thus the quality of the display panel is improved.

Figure 8:
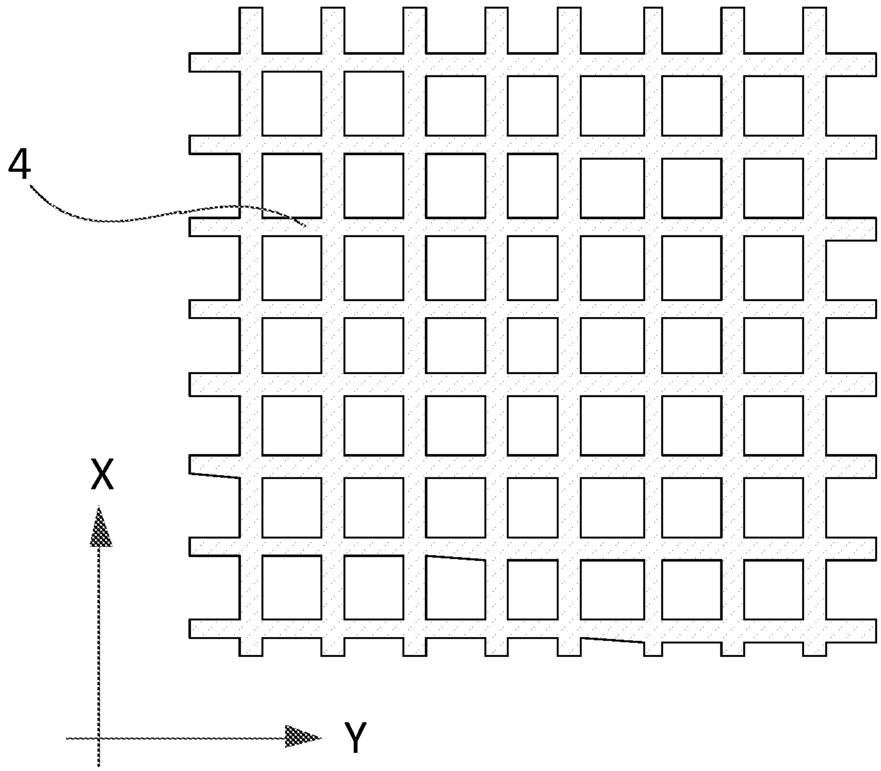
FIG. 8 is a top view of a first metal portion of a display panel according to an embodiment of the present disclosure.

As an embodiment, at least part of the multiple second grooves penetrate through the first metal portion 4 in a direction perpendicular to the substrate 1. When the first grooves and the second grooves completely penetrate through the first metal portion 4, the first metal portion 4 is in a form of multiple discrete metal dot matrixes arranged in an array. On the basis of a same principle, as shown in FIG. 8, which is a top view of a first metal portion 4 according to an embodiment of the present disclosure, multiple second metal strip-shaped structures extending in the second direction and arranged in the first direction may be provided on the basis of the first metal strip-shaped structures. At least part of the first metal strip-shaped structures and at least part of the second metal strip-shaped structures are mutually crossed to form a grid, and since a protrusion is prone to be formed at a crossed part of the first metal strip-shaped structure and the second metal strip-shaped structure, the first metal strip-shaped structure and the second metal strip-shaped structure are prepared on a same layer and made of a same material, whereby the protrusion formed at the mutually crossed part of the first metal strip-shaped structure and the second metal strip-shaped structure may be eliminated, and meanwhile, the whole grid structure may be more stable, and an anti-bending characteristic thereof is improved.

In a case where the first metal strip-shaped structure and the second metal strip-shaped structure form the grid, in an embodiment, the first metal strip-shaped structure and the second metal strip-shaped structure are arranged in a high-density manner, so that an interfering portion of regions of the upper organic film patterns is increased, and thus the flatness of the upper surface of the organic layer is further improved, whereby a scattering phenomenon of light emitted by the light emitting element and a scattering phenomenon of the first electrode 31 on the reflected ambient light may be ameliorated, the scattering problem of the display panel may be resolved, and thus the quality of the display panel is improved.

As an embodiment, the display panel further includes a driver circuit layer. The driver circuit layer is manufactured on the substrate 1 and located below the light emitting layer, and the driver circuit layer includes multiple thin film transistors. In an embodiment, an active layer of the thin film transistor in the driver circuit layer includes silicon, and the thin film transistor is a low-temperature polycrystalline silicon transistor. In another embodiment, an active layer of drive transistors in the driver circuit layer includes silicon, and an active layer of part of switching transistors in the driver circuit layer include metal oxide. For better flatness, no metal layer is arranged between the first metal layer and the first electrode 31. In a case where a certain metal layer in the driver circuit layer below the light emitting layer is also served as the first metal layer, a metal layer closest to the first electrode 31 is also served as the first metal layer. That is, no metal layer process is performed after the process of the first metal layer and before the manufacture of the first electrode 31 of the light emitting unit, and no other metal structure on top of the first metal layer affects the flatness of the substrate under the first electrode 31. After an organic insulating layer is manufactured on the first metal layer, a relatively flat substrate may be provided for manufacturing the first electrode 31, so that the first electrode 31 is manufactured with a better flatness, whereby a scattering phenomenon of light emitted by the light emitting element and a scattering phenomenon of the first electrode 31 on the reflected ambient light may be ameliorated, the scattering problem of the display panel is improved, and thus the display effect is improved.

Figure 9:
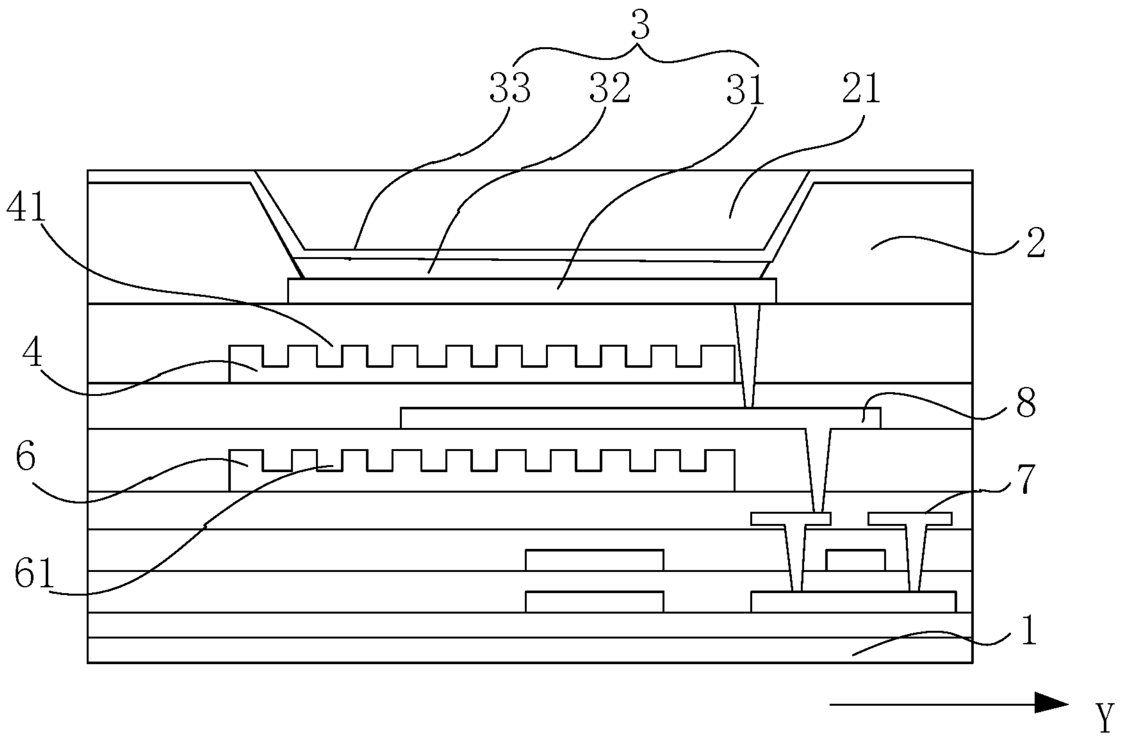
FIG. 9 is a schematic diagram of a display panel according to an embodiment of the present disclosure.

As an embodiment, as shown in FIG. 9, FIG. 9 is a schematic diagram of a display panel according to an embodiment of the present disclosure. An embodiment of the present disclosure further includes a second metal layer. The second metal layer and the first metal layer are disposed in different layers, and the second metal layer includes multiple second metal portions 6, and the multiple second metal portions 6 at least partially overlaps with the multiple first metal portions 4 in a direction perpendicular to the substrate 1.

The second metal portion 6 includes multiple third grooves 61 which extend in a third direction and are arranged in a fourth direction, and the third direction and the fourth direction intersect within the plane parallel to the substrate. The third direction may be in a same direction with the first direction X, and in an embodiment, the third direction may also intersect the first direction X within the plane parallel to the substrate. It is only used as an example in FIG. 9 that the third direction is in a same direction with the first direction X. When the third direction intersects with the first direction X, the flattening effect of the second metal portion 6 may be complementary to the flattening effect of the first metal portion 4 to achieve an optimal flattening effect.

As an embodiment, at least part of the multiple third grooves 61 penetrate through the second metal portion 6 in a direction perpendicular to the substrate 1, and two adjacent third grooves 61 penetrating through the second metal portion 6 divide the second metal portion 6 into multiple third metal strip-shaped structures which extend in the third direction and arranged in the fourth direction. In an embodiment, an arrangement density of the third metal strip-shaped structures is different from the arrangement density of the first metal strip-shaped structures, or the arrangement density of the third metal strip-shaped structures is different from the arrangement density of the second metal strip-shaped structures, so that an interfering portion of regions of organic film patterns above the first metal portion 4 and an interfering portion of regions of organic film patterns above the second metal portion 6 are staggered, so that the flatness of the upper surface of the organic layer is further improved, whereby a scattering phenomenon of light emitted by the light emitting unit and a scattering phenomenon of the first electrode 31 on the reflected ambient light may be ameliorated, the scattering problem of the display panel may be resolved, and thus the quality of the display panel may be improved.

Figure 10:
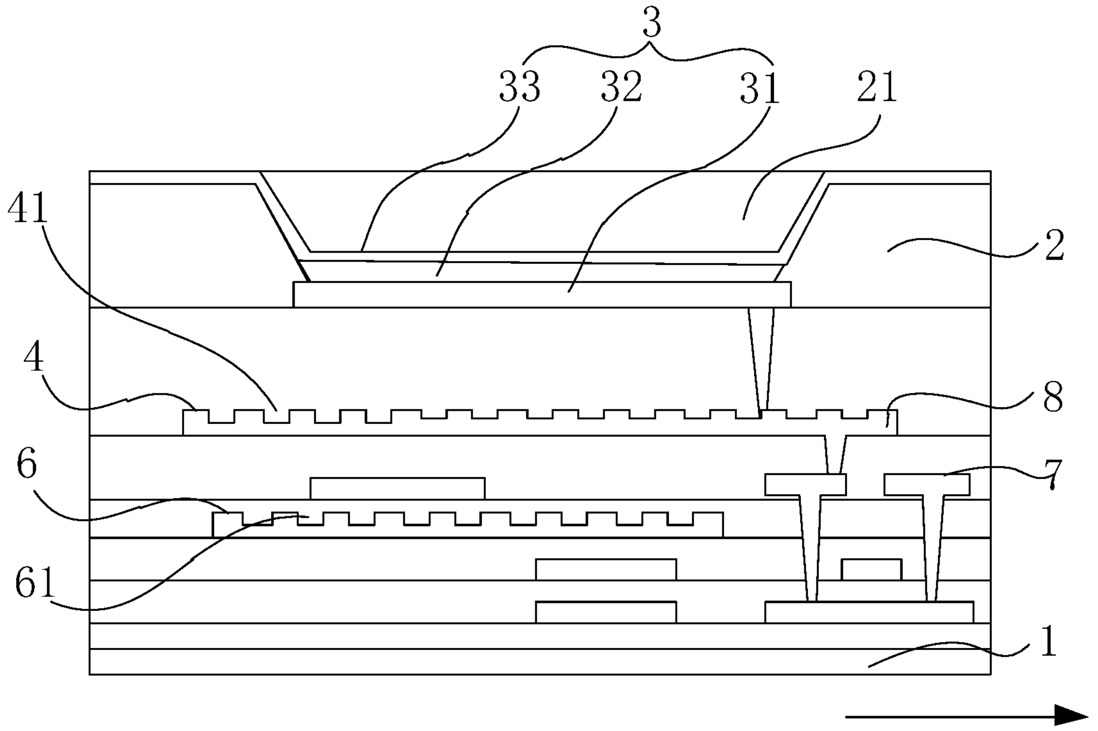
FIG. 10 is a schematic diagram of a display panel according to an embodiment of the present disclosure.

As an embodiment, the display panel further includes a driver circuit layer, the driver circuit layer is manufactured on the substrate 1 and located below the light emitting layer, and the driver circuit layer includes multiple thin film transistors. The driver circuit layer at least includes a third metal layer 7 and a fourth metal layer 8, and the fourth metal layer 8 is located on a side of the third metal layer 7 facing the pixel defining layer 2. The first metal layer 4 may be located between the fourth metal layer 8 and the first electrode 31 (as shown in FIG. 9). Since typically, a metal with a large area is used for the fourth metal layer 8, as shown in FIG. 10, which is a schematic diagram of a display panel according to an embodiment of the present disclosure, the first metal layer 4 may be manufactured by that the fourth metal layer 8 may be also served as the first metal layer 4.

Continuing referring to FIG. 9, in order to achieve a better flattening effect and to make the first metal layer 4 and the second metal layer 6 evenly distributed among respective film layers, as an embodiment, the second metal layer 6 is located between the third metal layer 7 and the fourth metal layer 8. Therefore, the flatness of the upper surface of the organic layer is further improved, whereby a scattering phenomenon of light emitted by the light emitting unit and a scattering phenomenon of the first electrode 31 on the reflected ambient light may be ameliorated, the scattering problem of the display panel may be resolved, and thus the quality of the display panel may be improved.

Figure 11:
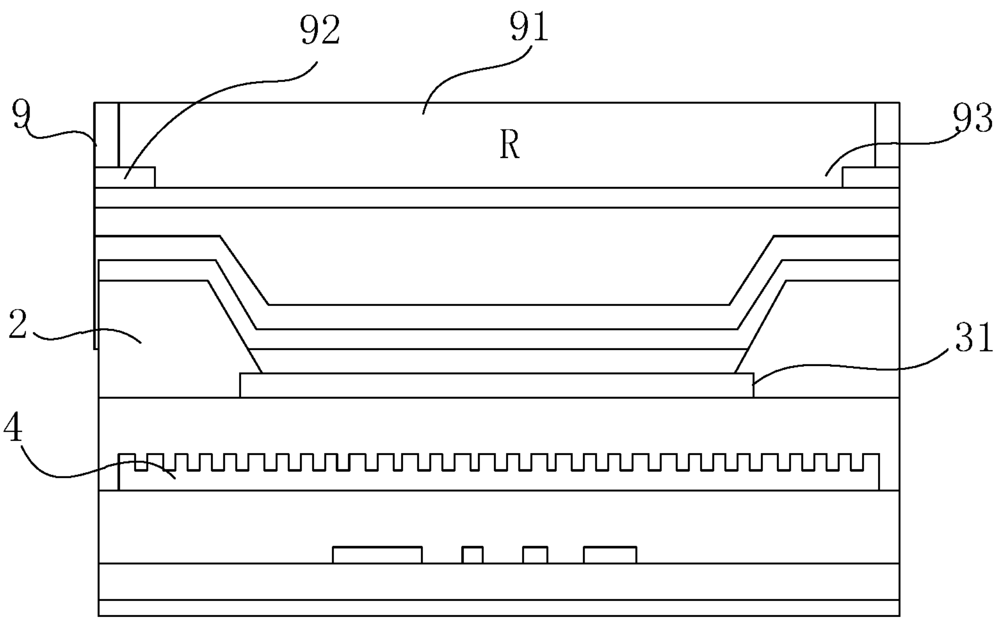
FIG. 11 is a schematic diagram of a display panel according to an embodiment of the present disclosure.

As an embodiment, as shown in FIG. 11, which is a schematic diagram of a display panel according to an embodiment of the present disclosure, the display panel further includes a light filtering layer 9. The light filtering layer 9 is located on a side of the light emitting unit facing away from the substrate 1 and includes multiple light filtering units 91 and multiple light shielding portions 92 (only one light filtering unit 91 and one light shielding portion 92 are shown in FIG. 11 as an example). The multiple light shielding portions define multiple first openings 93, and a vertical projection of a light filtering unit 91 on a plane where the light shielding portion 92 is located covers a first opening 93, that is, the first opening 93 overlaps with the light filtering unit 91 in the light emitting direction of the display panel, and meanwhile, the first opening 93 overlaps with the light emitting unit, and a vertical projection of the first metal portion 4 on the light filtering layer 9 at least covers the first opening 93 and at least overlaps with the light shielding portion 92.

The light filtering unit 91 may transmit visible light with a wavelength in a specific wavelength range, for example, a red light filtering unit may transmit red light, a green light filtering unit may transmit green light, and a blue light filtering unit may transmit blue light, that is, the light filtering unit 91 can prevent light with a wavelength within a wavelength range other than the specific wavelength range from being transmitted, and can reduce light amount of the ambient light taken into the display panel, whereby the reflection of the first electrode 31 to the ambient light is reduced, that is, the reflection of the display panel to the ambient light is reduced. The light shielding portion 92 is located between two adjacent light filtering units 91. The light shielding portion 92 may block light and avoid cross-talk between lights emitted from adjacent light emitting units. Therefore, it can be understood that the first opening 93 on the light shielding portion 92 defines a light emitting area of a corresponding light emitting unit.

As shown in FIG. 2, in practice, such grid-like surface can better ameliorate the flatness of a surface of an organic layer at which the grid is located, but a large organic layer difference still occurs at an edge of a grid-like metal. In order to prevent the organic layer difference from affecting the display effect, as an embodiment, the vertical projection of the first metal portion 4 on the light filtering layer 9 covers the first opening 93 and at least overlaps with the light shielding portion 92 in the light emitting direction of the display panel. In this way, the flatness of the first electrode 31 exposed through the first opening 93 can be ensured to a maximum extent. In a case where an area of the first electrode 31 is larger than the first opening 93, a region which is not flat can be hidden below the light shielding portion 92, so that it is invisible by human eyes, and the quality of the display panel can be improved.

Figure 12:
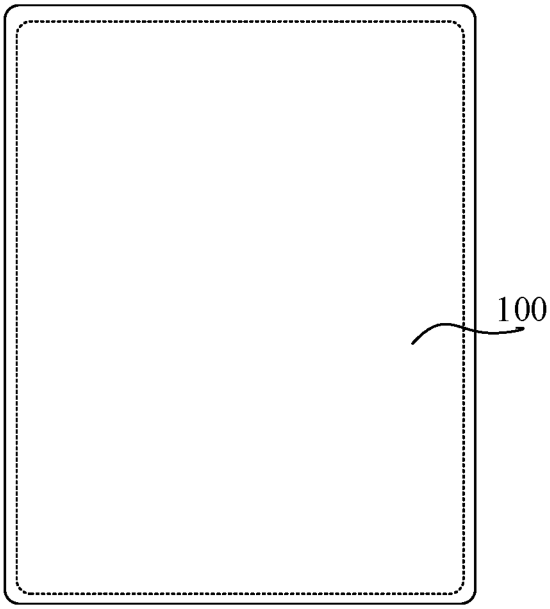
FIG. 12 is a schematic diagram of an embodiment of a display device according to the present disclosure.

Embodiments of the present disclosure further provide a display device. FIG. 12 is a schematic diagram of a display device according to an embodiment of the present disclosure. As shown in FIG. 12, the display device includes the display panel 100 provided in any one of the embodiments of the present disclosure. The structure of the display panel 100 has been described in the embodiments of the display panel described above and will not be described herein. The display device in the embodiments of the present disclosure may be any device having a display function such as a mobile phone, a tablet computer, a laptop computer, an electronic paper book, a TV, or an intelligent wearable product.

In the above description, merely the preferred embodiments of the present disclosure are described, which should not be considered as limitations of the present disclosure, and any modifications, equivalents, improvements and the like made within the principle of the present disclosure should be included within the scope of protection of the present disclosure.

Finally, it should be noted that the above embodiments are only used for illustrating the technical schemes of the present disclosure, and are not intended to limit the present disclosure. Although in the present disclosure has been described in detail with reference to the foregoing embodiments, it should be understood by those skilled in the art that: the technical schemes recited in the foregoing embodiments may still be modified, or some or all of technical features may be equivalently substituted; and these modifications or substitutions do not make the essence of a corresponding technical scheme deviate from the scope of the technical scheme of the embodiments of the present disclosure.

What is claimed is:

1. A display panel, comprising:

a substrate;

a pixel defining layer, which is located on a side of the substrate and comprises a plurality of pixel openings arranged in an array;

a light emitting unit, which is located within a pixel opening of the plurality of pixel openings and comprises a first electrode, a light emitting layer and a second electrode which are sequentially laminated in a light emitting direction of the display panel; and a first metal layer, which is located on a side of the first electrode facing the substrate;

wherein the first metal layer comprises a plurality of first metal portions, a vertical projection of a first metal portion of the plurality of first metal portions on the substrate overlaps with a vertical projection of the first electrode on the substrate, the first metal portion comprises a plurality of first grooves which extend in a first direction and are arranged in a second direction, and the first direction intersects the second direction within a plane parallel to the substrate;

wherein the display panel further comprises a second metal layer, the second metal layer and the first metal layer are disposed at different layers, the second metal layer is located between the first metal layer and the substrate, and the second metal layer and the first electrode are disposed at different layers;

wherein the second metal layer comprises a plurality of second metal portions, and a vertical projection of a second metal portion of the plurality of second metal portions on the substrate at least partially overlaps with a vertical projection of the first metal portion on the substrate; and in a direction perpendicular to the substrate, the second metal portion is located between the first metal portion and the substrate, and a vertical projection of the second metal portion on the substrate overlaps with a vertical projection of the pixel opening on the substrate; and wherein the display panel further comprises a driver circuit layer, the driver circuit layer is located on a side of the pixel defining layer facing the substrate and comprises a fourth metal layer, and in the direction perpendicular to the substrate, the first metal layer is located between the fourth metal layer and the first electrode, and the fourth metal layer is located between the second metal layer and the first metal layer.

2. The display panel of claim 1, wherein at least part of the plurality of first grooves penetrate through the first metal portion in the direction perpendicular to the substrate.

3. The display panel of claim 1, wherein an angle θ exists between the first direction and a pixel column direction in a display region, and 0° <θ<90° is satisfied.

4. The display panel of claim 1, wherein the first metal portion comprises a plurality of second grooves which extend in the second direction and are arranged in the first direction, and at least part of the plurality of first grooves and at least part of the plurality of second grooves are crossed to form a grid.

5. The display panel of claim 4, wherein at least part of the plurality of second grooves penetrate through the first metal portion in the direction perpendicular to the substrate.

6. The display panel of claim 1, wherein no metal layer is arranged between the first metal layer and the first electrode.

7. The display panel of claim 1, wherein the second metal portion comprises a plurality of third grooves which extend in a third direction and are arranged in a fourth direction, the third direction and the fourth direction intersect within the plane parallel to the substrate, and the third direction intersects the first direction within the plane parallel to the substrate.

8. The display panel of claim 7, wherein at least part of the plurality of third grooves penetrate through the second metal portion in the direction perpendicular to the substrate.

9. The display panel of claim 1, wherein the driver circuit layer comprises a third metal layer, and the fourth metal layer is located on a side of the third metal layer facing the pixel defining layer, and wherein, in the direction perpendicular to the substrate, the second metal layer is located between the third metal layer and the fourth metal layer.

10. The display panel of claim 1, further comprising a light filtering layer, wherein the light filtering layer is located on a side of the light emitting unit facing away from the substrate and comprises a plurality of light filtering units and a plurality of light shielding portions, the plurality of light shielding portions define a plurality of first openings, and a vertical projection of a light filtering unit of the plurality of light filtering units on a plane where a light shielding portion of the plurality of light shielding portions is located covers a first opening of the plurality of first openings;

wherein the first opening overlaps the light emitting unit in the light emitting direction of the display panel, and a vertical projection of the first metal portion on the light filtering layer covers the first opening and at least overlaps the light shielding portion.

11. A display device comprising the display panel according to claim 1.

12. The display device of claim 11, wherein no metal layer is arranged between the first metal layer and the first electrode.

13. The display device of claim 11, further comprising a light filtering layer, wherein the light filtering layer is located on a side of the light emitting unit facing away from the substrate and comprises a plurality of light filtering units and a plurality of light shielding portions, the plurality of light shielding portions define a plurality of first openings, and a vertical projection of a light filtering unit of the plurality of light filtering units on a plane where a light shielding portion of the plurality of light shielding portions is located covers a first opening of the plurality of first openings;

wherein the first opening overlaps the light emitting unit in the light emitting direction of the display panel, and a vertical projection of the first metal portion on the light filtering layer covers the first opening and at least overlaps the light shielding portion.

14. The display device of claim 11, wherein an angle θ exists between the first direction and a pixel column direction in a display region, and 0° <θ<90° is satisfied.

15. The display device of claim 11, wherein the first metal portion comprises a plurality of second grooves which extend in the second direction and are arranged in the first direction, and at least part of the plurality of first grooves and at least part of the plurality of second grooves are crossed to form a grid.

16. The display device of claim 15, wherein at least part of the plurality of second grooves penetrate through the first metal portion in the direction perpendicular to the substrate.

17. The display device of claim 11, wherein the second metal portion comprises a plurality of third grooves which extend in a third direction and are arranged in a fourth direction, the third direction and the fourth direction intersect within the plane parallel to the substrate, and the third direction intersects the first direction within the plane parallel to the substrate.

18. The display device of claim 17, wherein at least part of the plurality of third grooves penetrate through the second metal portion in the direction perpendicular to the substrate.

19. The display device of claim 11, wherein the driver circuit layer further comprises a third metal layer, and the fourth metal layer is located on a side of the third metal layer facing the pixel defining layer, and wherein, in the direction perpendicular to the substrate, the second metal layer is located between the third metal layer and the fourth metal layer.

* * * * *